(12) United States Patent
Lee (10) Patent No.: US 7,170,157 B2
(45) Date of Patent: Jan. 30, 2007

(54) SEMICONDUCTOR PACKAGE HAVING MULTIPLE EMBEDDED CHIPS

(75) Inventor: Ho-Cheol Lee, Yongin-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/803,043

(22) Filed: Mar. 18, 2004

(65) Prior Publication Data

US 2005/0001300 A1 Jan. 6, 2005

(30) Foreign Application Priority Data

Jul. 2, 2003 (KR) .................... 10-2003-0044677

(51) Int. Cl.
*H01L 23/02* (2006.01)
*H01L 23/34* (2006.01)

(52) U.S. Cl. .............. 257/685; 257/685; 257/686; 257/723; 327/518

(58) Field of Classification Search ............ 257/686, 257/777, 685; 438/109
See application file for complete search history.

(56) References Cited

U.S. PATENT DOCUMENTS

| | | | |
|---|---|---|---|
| 5,866,924 A * | 2/1999 | Zhu ........................ | 257/208 |
| 5,903,607 A | 5/1999 | Liu | |
| 5,949,139 A * | 9/1999 | Imura et al. ............. | 257/723 |
| 5,987,587 A * | 11/1999 | Meltzer ................. | 712/23 |
| 6,093,933 A * | 7/2000 | Farnworth et al. ....... | 257/48 |
| 6,215,192 B1 * | 4/2001 | Hirata et al. ........... | 257/777 |
| 6,271,587 B1 * | 8/2001 | Patti ..................... | 257/724 |
| 6,392,304 B1 * | 5/2002 | Butler ................... | 257/777 |
| 6,566,760 B1 * | 5/2003 | Kawamura et al. ....... | 257/777 |
| 2005/0017341 A1 | 1/2005 | Egerer | |
| 2006/0036884 A1 | 2/2006 | Gammel et al. | |

FOREIGN PATENT DOCUMENTS

| | | |
|---|---|---|
| DE | 103 29 646 A1 | 9/2004 |
| DE | 103 15 303 A1 | 11/2004 |
| DE | 103 23 861 A1 | 12/2004 |
| JP | 11-054693 | 2/1999 |

OTHER PUBLICATIONS

Korean Office Action dated Sep. 30, 2005.
German Patent Office Action dated Feb. 24, 2006 for corresponding German patent application No. 102004029844.0-33.

* cited by examiner

*Primary Examiner*—Nathan J. Flynn
*Assistant Examiner*—Ben Sandvik
(74) *Attorney, Agent, or Firm*—Harness, Dickey & Pierce, P.L.C.

(57) ABSTRACT

A semiconductor package includes multiple embedded chips, each chip including a common circuit having substantially the same common function. The common circuit in a selected one of the chips is enabled. The common circuit in one or more other ones of the chips is disabled. As a result, the enabled common circuit performs the common function for the selected chip and the one or more other chips.

18 Claims, 7 Drawing Sheets

Fig. 1

(BACKGROUND ART)

SEMICONDUCTOR PACKAGE HAVING MULTIPLE EMBEDDED CHIPS

RELATED APPLICATION

This application relies for priority upon Korean Application No. 10-2003-0044677, filed on Jul. 2, 2003, the contents of which are herein incorporated by reference in their entirety.

BACKGROUND OF THE INVENTION

A multi-chip package is fabricated by electrically connecting logic-chips to memory-chips after such chips have been stacked upon each other. A logic-chip is a kind of micro device, and a memory-chip is capable of storing/regenerating information. In a multi-chip package, logic and memory chips are packaged simultaneously, advantageously resulting in a small package volume that is suitable for miniaturization of electronic products.

For example, in a two chip variety of multi-chip package, two stacked chips are electrically connected together plus the chips are electrically connected to a lead frame. The lead-frame provides connections with an external electronic device. In this case, conventionally, a bonding pad equipped with the chips is electrically connected to the lead-frame via a wire boding technique.

Specifically, in the multi-chip package, each chip includes one or more common circuits, namely one or more circuits having the same function as circuits within other chips in the package, e.g., a power circuit or a clock generator. In the case that each chip is the same, then all components in the chips will be the same.

For example, the chips in the package all have power circuits, respectively. Power circuits generate all sorts of power used in the chip by adapting external power signals.

Figure 1:
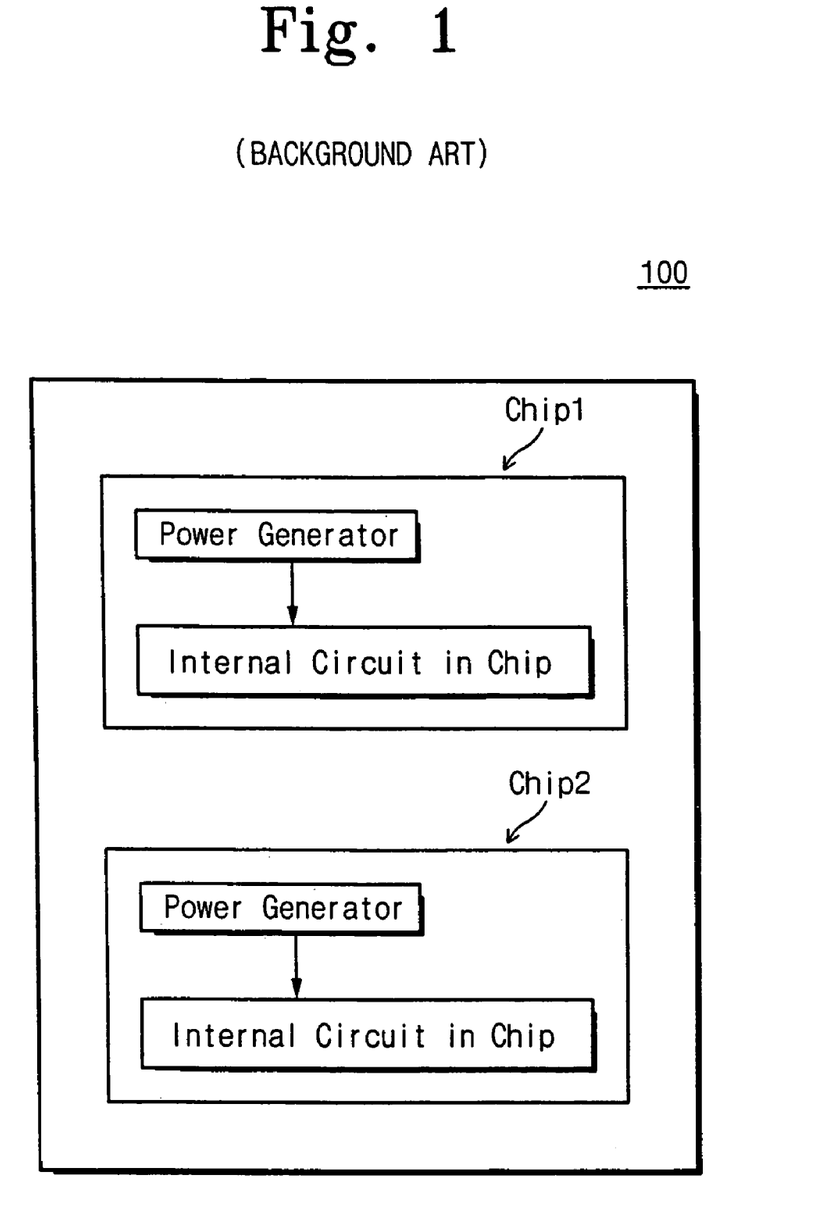
FIG. 1 is a block diagram showing a semiconductor constituted of two chips each of which includes a power circuit and an internal circuit of the respective chip, according to the Background Art.

FIG. 1 is a view showing a semiconductor package 100 constituted of two chips, chip 1 and chip 2, each of which includes a power circuit and an internal circuit of the chip. Because both chips have a power circuit, the overall current consumed by semiconductor package 100 increases.

In a mobile apparatus such as a cell phone, it is important to maximize the amount of operating time delivered by a single full charge of the battery (or in other words, maximize battery life). Increased current consumption due to the presence of multiple operating power circuits in a multi-chip package can thwart the goal of maximizing battery life.

SUMMARY OF THE INVENTION

According to at least one embodiment of the present invention, a semiconductor package is provided in which several chips are embedded, the chips including common circuits performing substantially the same common function, respectively. One of the common circuits in a selected one of the chips can be enabled while the common circuit in the other chips can be disabled. The enabled common circuit can perform the common function for the selected chip and for the other chips.

Additional features and advantages of the invention will be more fully apparent from the following detailed description of example embodiments, the accompanying drawings and the associated claims.

BRIEF DESCRIPTION OF THE DRAWINGS

The accompanying drawings are included to provide a further understanding of the present invention, and are incorporated in and constitute a part of this specification. The drawings illustrate example embodiments of the present invention and, together with the description, serve to explain the principles of the present invention. In the drawings.

DETAILED DESCRIPTION OF THE INVENTION

Reference will now be made in detail to the example embodiments of the present invention, which are illustrated in the accompanying drawings. However, the present invention is not limited to the embodiments illustrated hereinafter, and the embodiments herein are rather introduced to provide easy and complete understanding of the scope and spirit of the present invention.

Figure 2A:
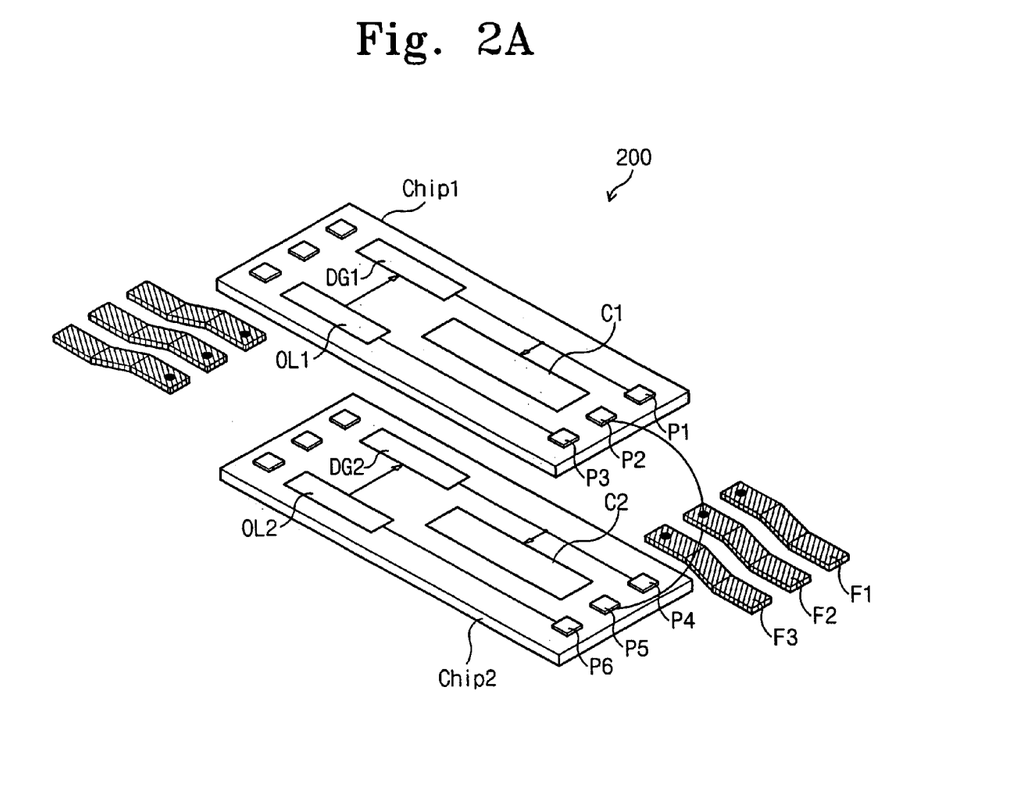
FIG. 2A is an exploded view showing a semiconductor package at a first stage in the arrangement of bonding wiring, according to at least one embodiment of the present invention.
Figure 2B:
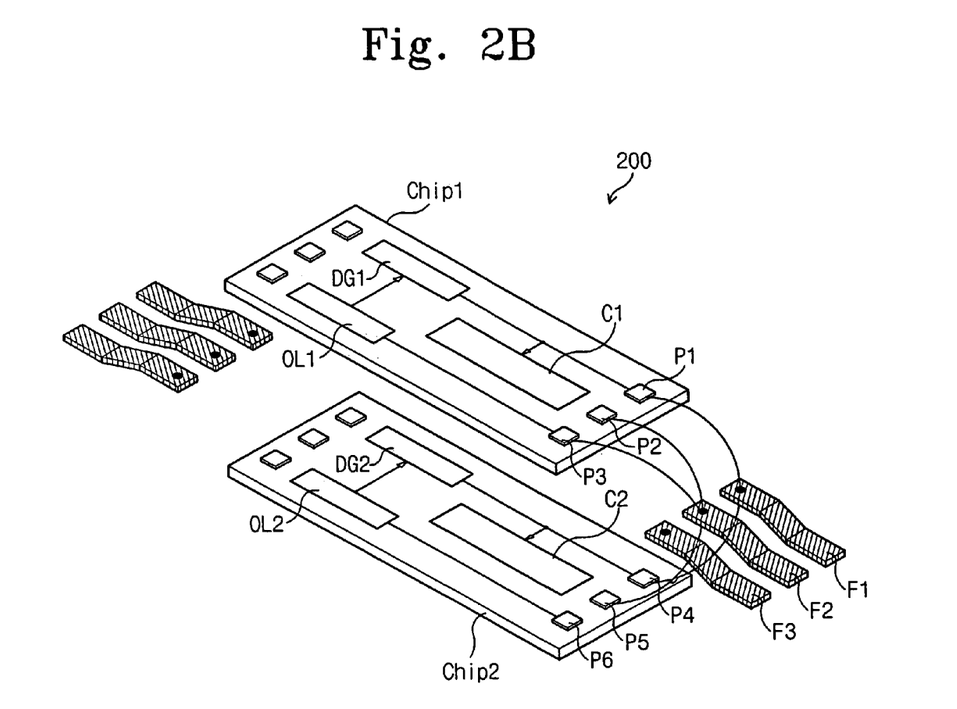
FIG. 2B is an exploded view showing the semiconductor package of FIG. 2B at a second state in the arrangement of the bonding wiring, according to at least one embodiment of the present invention.

FIG. 2A is an exploded view showing a semiconductor package 200 at a first stage in the arrangement of bonding wiring, according to at least embodiment of the present invention. FIG. 2B is a view of a semiconductor package 200 at a second stage in the arrangement of the bonding wiring according to at least one embodiment of the present invention.

Referring to FIGS. 2A and 2B, a lead-frame (F2) is electrically connected to a ground voltage $V_{ss}$.

Referring to FIG. 2A, semiconductor package 200 includes two chips (Chip1 and Chip 2). The first chip (Chip1) includes a power generator (DG1), a selecting circuit (OL1) and an internal circuit (C1). The second chip (Chip2) includes a power circuit (DG2), a selecting circuit (OL2) and internal circuit (C2).

The power circuits (DG1 and DG2) supply power to the internal circuits (C1 and C2), respectively. The power circuits (DG1 and DG2) are an example of a circuit common to the chips (Chip1 and Chip2) that performs substantially the same function. In addition to, or instead of, a power generator, the common current can include a signal generator and/or a clock buffer, etc.

The selecting circuits (OL1 and OL2) enable/disable the power circuits (DG1 and DG2, respectively) and function as switches for the power circuits (DG1 and DG2).

When the ground voltage $V_{ss}$ is connected to an input of the selecting circuit (e.g., OL1), the selecting circuit (OL1) sends a disable control signal to the power generator (e.g., DG1). As a result, the power generator (DG1) becomes disabled.

In addition, when the ground voltage $V_{ss}$ is not connected to the input of the selecting circuit (e.g., OL1), the disable control signal is not generated. Accordingly, the power circuit (e.g., DG1) is not disabled (or, in other words, is enabled) to supply power to the chip (e.g., Chip1).

Alternatively, when a supply voltage $V_{dd}$ is connected to the input of the selecting circuit (e.g., OL1), the selecting circuit (OL1) sends a disable control signal to the power generator (e.g., DG1). As a result, the power generator (DG1) becomes disabled. When a supply voltage $V_{dd}$ is not connected to the input of the selecting circuit (OL1), the disable control signal is not generated such that the power generator (DG1) is not disabled to supply power to the chip (e.g., Chip1).

Referring to FIG. 2A, the power generator (DG1) and the selecting circuit (OL1) are connected to a pad (P1) and a pad (P3), respectively. Additionally, the power generator (DG2) and the selecting circuit (OL2) are connected to a pad (P4) and a pad (P6), respectively.

In FIG. 2A, bonding wiring connects the pads (P2 and P5) with the lead-frame (F2) held at the ground voltage $V_{ss}$. The pads (P1, P3, P4 and P6) are not connected to each other. As a result, the power generator (DG1) of the first chip (Chip1) and the power generator (DG2) of the second chip (Chip2) separately supply power to the chips (Chip1 and Chip2), respectively.

Referring to FIG. 2B, in the same way as in FIG. 2A, the power generators (DG1 and DG2) and the selecting circuits (OL1 and OL2) are connected to the pads (P1 and P4) and the pads (P3 and P6), respectively. The pads (P2 and P5) are connected to the lead-frame (F3) at the ground voltage $V_{ss}$.

However, referring to FIG. 2B, the pad (P1) is connected through bonding wiring to a lead-frame (F1), and the pad (P4) is connected through bonding wiring to the lead-frame (F1). Accordingly, the pad (P1) is electrically connected to the pad (P4). Resultantly, the power generator (DG1) is electrically connected to the power generator (DG2). Also, the pad (P3) is connected through bonding wiring to the lead-frame (F2), thereby being connected to the ground voltage $V_{ss}$.

In FIG. 2B, since the pad (P3) is connected through bonding wiring with the lead-frame (F2) held at the ground voltage $V_{ss}$, the ground voltage $V_{ss}$ is connected to the input of the selecting circuit (OL1). Therefore, the selecting circuit (OL1) sends the disable control signal to the power circuit (DG1). As a result, the power generator (DG1) is disabled.

Furthermore, because the pad (P1) is connected through bonding wiring with the lead-frame (F2) to the pad (P4), the enabled (or, in other words, non-disabled) power generator (DG2) rather than the disabled power generator (DG1) supplies power to both of the chips (Chip1 and Chip2). Relative to FIG. 2A, the arrangement of FIG. 2B consumes less current. Also, there is a beneficial economy to the disabling arrangement of FIG. 2B relative to design and manufacture of a version of the second chip (Chip2) that does not include the power generator (DG2).

Referring to FIGS. 2A and 2B, the lead-frame (F2), e.g., is implemented by an external pin connected to an external apparatus, and the lead-frame (F1), e.g., is implemented by an internal pin for connecting the chips in the package.

The semiconductor package 200 is depicted in FIGS. 2A–2B as having two embedded chips of the same constitution. But that should not be understood as limiting because semiconductor package 200 is contemplated as including two or more embedded chips of the same or different constitutions and/or characteristics.

In FIG. 2B, only the power generator (DG2) of one of chips (Chip2) in semiconductor package 200 is enabled. The power generator (DG2) of other chips (Chip1) is disabled. As a result, the enabled power generator DG1 acts as the source of power for both chips (Chip2 and Chip1) in the semiconductor package 200.

Figure 3A:
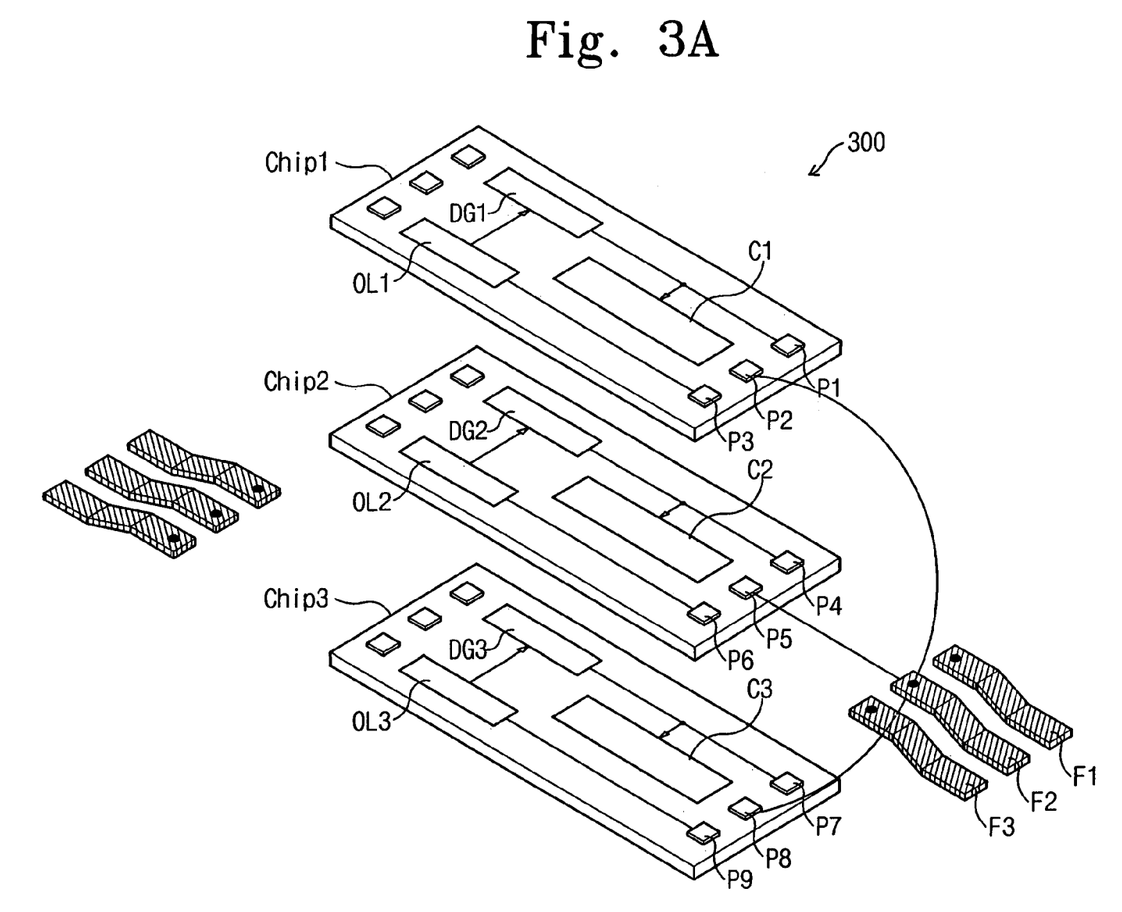
FIG. 3A is an exploded view showing of a semiconductor package at a first stage in the arrangement of bonding wiring, according to at least one embodiment of the present invention.
Figure 3B:
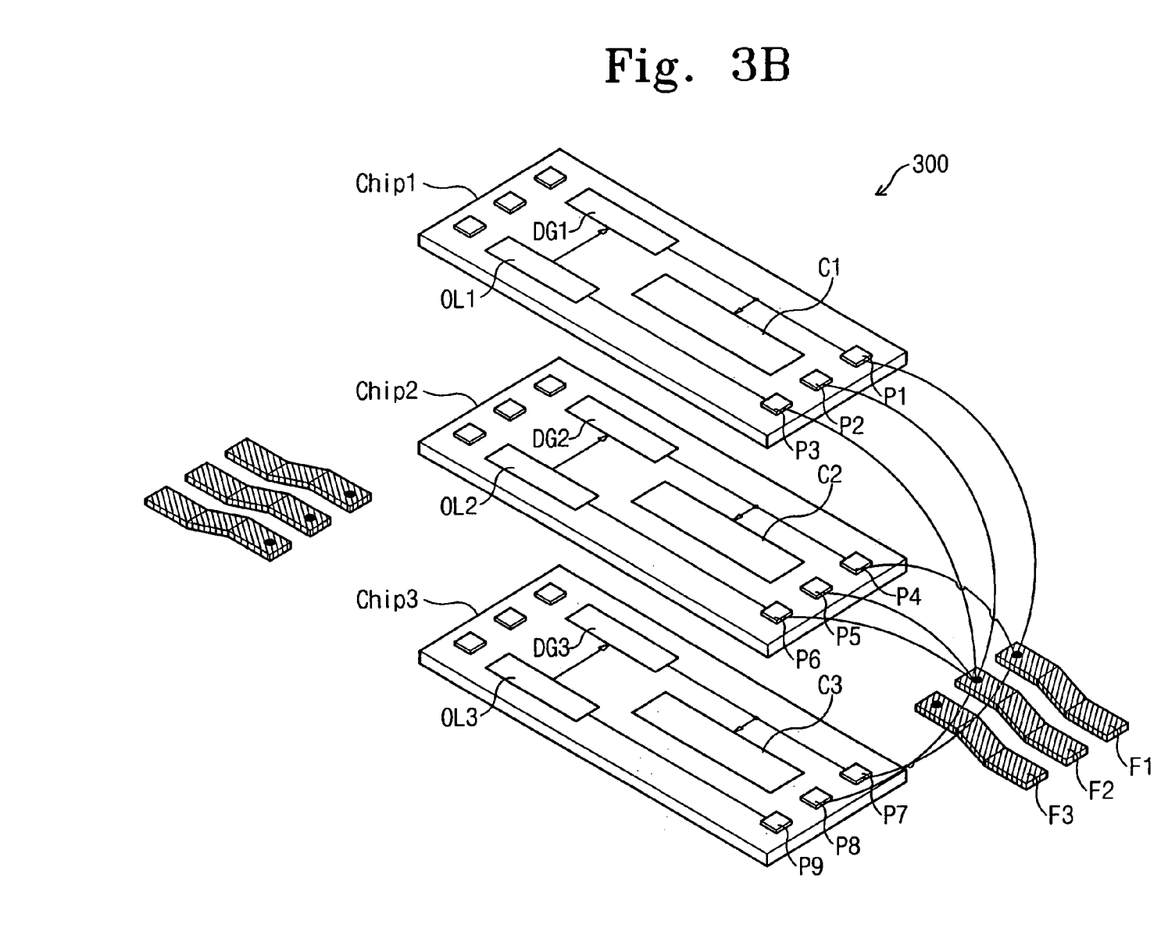
FIG. 3B is an exploded view showing of a semiconductor package of FIG. 3B at a second stage in the arrangement of the bonding wiring, according to at least one embodiment of the present invention.

FIG. 3A is an exploded view showing a semiconductor package 300 at a first stage in the arrangement of bonding wiring according to at least one embodiment of the present invention. FIG. 3B is an exploded view showing semiconductor package 300 at a second state in the arrangement of the bonding wiring, according to at least one embodiment of the present invention.

As shown in FIGS. 3A and 3B, the lead-frame (F2) is connected to the ground voltage $V_{ss}$.

Referring to FIG. 3A, semiconductor package 300 includes three chips (Chip1, Chip2 and Chip3). The chips (Chip1, Chip2 and Chip3) include the power generators (DG1, DG2 and DG3) and the selecting circuits (OL1, OL2 and OL3) and the internal circuits (C1, C2 and C3), respectively.

The power generators (DG1, DG2 and DG3) supply power to internal circuits (C1, C2 and C3), respectively.

The selecting circuits (OL1, OL2 and OL3) enable/disable the power circuits (DG1, DG2 and DG3) and function as switches of the power circuit (DG1, DG2 and DG3), respectively.

Selecting circuits (OL1, OL2 and OL3) of FIGS. 3A–3B operate in the same manner as the selecting circuits (OL1 and OL2) of FIGS. 2A–2B.

Referring to FIG. 3A, the power generator (DG1) and the selecting circuit (OL1) are connected to a pad (P1) and a pad (P3), respectively. The power generator (DG2) and the selecting circuit (OL2) are connected to a pad (P4) and a pad (P6), respectively. And the power generator (DG3) and the selecting circuit (OL3) are connected to a pad (P7) and a pad (P9), respectively.

The pads (P2, P5 and P8) are connected through bonding wiring with the lead-frame (F2) held at the ground voltage $V_{ss}$. The pads (P1, P3, P4, P6, P7 and P9) are not connected to each other. As a result in FIG. 3A, the power generator (DG1) of the first chip (Chip1), the power generator (DG2) of the second chip (Chip2) and the power generator (DG3) of the chip (Chip3) separately supply power to the chips (Chip1, Chip2 and Chip3), respectively.

Referring to FIG. 3B, in the same way as FIG. 3A, the power generators (DG1, DG2 and DG3) and the selecting circuits (OL1, OL2 and OL3) are connected to the pads (P1, P4 and P7) and the pads (P3, P6 and P9), respectively. The pads (P2, P5 and P8) are connected to the lead-frame (F2) at the ground voltage $V_{ss}$.

Because the pads (P1, P4, P7) are electrically connected to each other, the power generators (DG1, DG2 and DG3) are electrically connected to each other Also, the pads (P3 and P6) are connected through bonding wiring to the lead-frame (F2), thereby being connected to the ground voltage $V_{ss}$. As such the ground voltage $V_{ss}$ is connected via the pads (P3 and P6) to the input of the selecting circuits (OL1 and OL2), respectively. Therefore, the selecting circuits (OL1 and OL2) send the disable control signal to the power circuits (DG1 and DG2), respectively. As a result, the power generators (DG1 and DG2) are disabled.

Furthermore, the pads (P1, P4 and P7) are connected through bonding wiring and the lead-frame (F2) to each other, so that the enabled power generator (DG3) rather than the disabled power generators (DG1 and DG2) supplies power to the chips (Chip1, Chip2 and Chip3). Relative to FIG. 3A, the arrangement of FIG. 3B consumes less current.

Figure 4A:
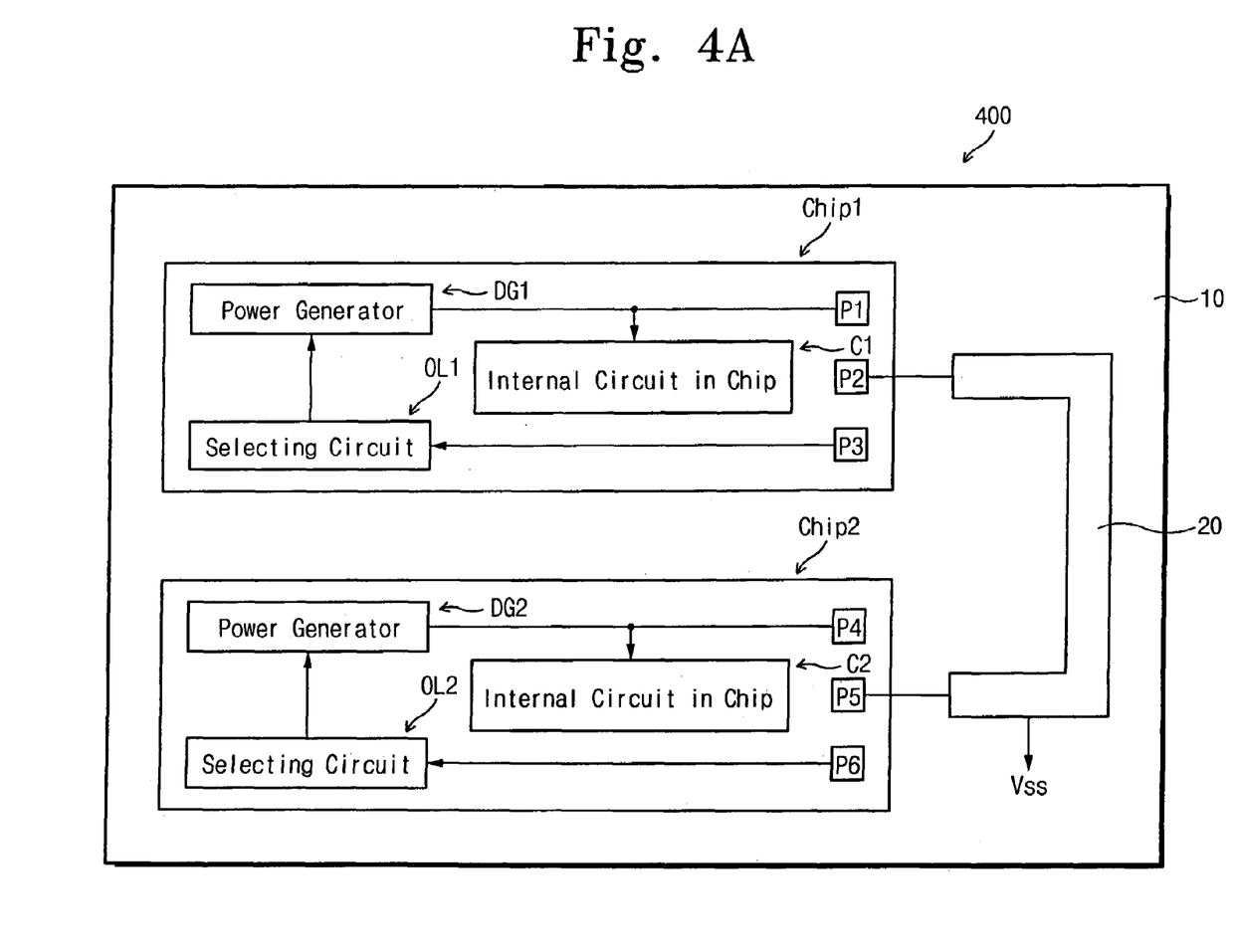
FIG. 4A is a block diagram showing a semiconductor package using a Printed-Circuit-Board (PCB) at a first stage of interconnection, according to at least one embodiment of the present invention.
Figure 4B:
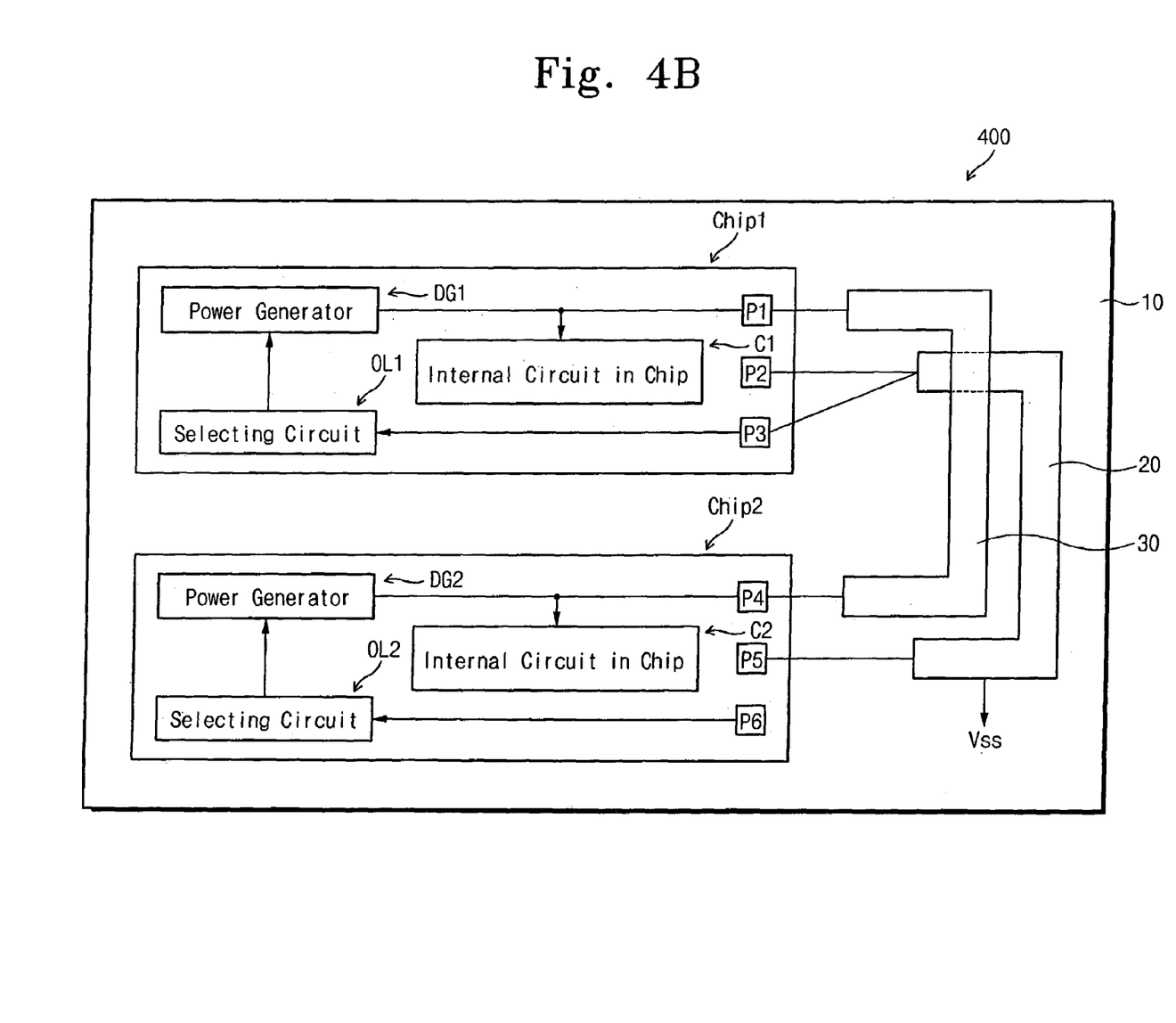
FIG. 4B is a block diagram showing the semiconductor package of FIG. 4A at a second stage of interconnection, according to at least one embodiment of the present invention.

FIG. 4A is a block diagram showing a semiconductor package 400 using a Printed-Circuit-Board (PCB) 10 at a first stage of interconnection, according to at least one embodiment of the present invention. FIG. 4B is a block diagram showing the semiconductor package 400 at a second stage of interconnection for PCB 10, according to at least one embodiment of the present invention.

Referring to FIG. 4A, the semiconductor package 400 includes two chips (Chip1 and Chip2) that themselves include the power generators (DG1 and DG2) and the selecting circuits (OL1 and OL2), respectively, all formed on the PCB 10.

Referring to FIG. 4A, the pads (P2 and P5) are connected through a connection part 20 to the ground voltage $V_{ss}$. The pads (P1, P3, P4 and P6) are not connected each other. As a result, the power generator (DG1) of the first chip (Chip1) and the power generator (DG2) of the second chip (Chip2) separately supply power to the chips (Chip1 and Chip2), respectively.

Referring to FIG. 4B, the pads (P1 and P4) are electrically connected through a connection part 30 to each other. Accordingly, the power generators (DG1 and DG2) are electrically connected to each other. In addition, the pad (P3) is connected to the ground voltage $V_{ss}$ via the connection part 20. Therefore, the selecting circuit (OL1) sends the disable control signal to the power generator (DG1), thereby disabling it.

Additionally, since the pad (P1) is connected to the pad (P4), the enabled power generator (DG2) rather than the disabled power generator (DG1) supplies power to the chips (Chip1 and Chip2). Relative to FIG. 4A, the arrangement of FIG. 4B consumes less current.

One of the multiple chips can be, e.g., a memory chip or a microprocessor chip. Alternatively, the multiple chips can include the microprocessor chip and the memory chip. The memory chip may be any one of Dynamic Access Memory (DRAM), Static Random Access Memory (SRAM) and Flash Memory.

This invention may, however, be embodied in a semiconductor package with different numbers of chips having different forms and should not be constructed as limited to the semiconductor package having the same forms set forth.

Furthermore, a semiconductor package embedding chips having different constitutions and/or characteristics can be applicable to the present invention.

In other words, similar to an MCP (Multi-Chip-Package) and an SIP (System-In-Package), even if chips with different specifications are embedded in one package, each chip would have a common circuit providing substantially the same function such, e.g., a power generator. While some of the power generators can be disabled, one power generator can be enabled to supply power to its own chip and connected supply power to the other chips in which the power generators are disabled, so that overall current consumption can be decreased at the package level.

As previously mentioned, according to at least one embodiment of the present invention, all chips can be operated normally in the semiconductor package by activating any one of multiple circuits capable of performing the same function. As a result, overall current consumption can be decreased in the semiconductor package.

The invention being thus described, it will be obvious that the same may be varied in many ways. Such variations are not to be regarded as a departure from the spirit and scope of the invention, and all such modifications are intended to be included within the scope of the invention.

What is claimed is:

1. A semiconductor package in which multiple chips are embedded, each chip including a common circuit having substantially the same common function,
    the common circuit in a selected one of the chips being enabled,
    the common circuit in one or more other ones of the chips being disabled, and
    the enabled common circuit performing the common function for the selected chip and the one or more other chips.

2. The semiconductor package of claim 1, wherein at least one of the multiple chips is a semiconductor memory chip.

3. The semiconductor package of claim 1, wherein at least one of the multiple chips is a microprocessor chip.

4. The semiconductor package of claim 1, wherein at least one of the multiple chips is a microprocessor chip, and at least one of the other chips is a memory chip.

5. The semiconductor package of claim 1, wherein multiple chips comprise two chips.

6. The semiconductor package of claim 1, wherein the common circuit includes a power generator.

7. The semiconductor package of claim 1, wherein the common circuit includes a clock buffer.

8. The semiconductor package of claim 1, wherein the common circuit includes a signal generator.

9. A semiconductor package which multiple chips are embedded,
    each of the chips including a common circuit having substantially the same common function and a selection circuit,
    the common circuit in a selected one of the chips disabled not being disabled via the corresponding selection circuit,
    the common circuit in one or more of the other ones of the chips being disabled via the corresponding selection circuits, and
    the non-disabled common circuits performing the common function for the selected chip and for the one or more other chips.

10. The semiconductor package of claim 9, wherein at least one of the multiple chips is a semiconductor memory chip.

11. The semiconductor package of claim 9, wherein at least one of the multiple chips is a microprocessor chip.

12. The semiconductor package of claim 9, at least one of the multiple chips is a microprocessor chip, and at least one of the other chips is a semiconductor memory chip.

13. The semiconductor package of claim 9, wherein the multiple chips comprise two chips.

14. The semiconductor package of claim 9, wherein the common circuit includes a power generator.

15. The semiconductor package of claim 9, wherein the common circuit includes a clock buffer.

16. The semiconductor package of claim 9, wherein the common circuit includes a signal generator.

17. A method of reducing current consumption in a semiconductor package in which multiple chips are to be embedded, the method comprising:

provinding multiple chips, each chip including a common circuit having substantially the same common function;

enabling the common circuit in a selected one of the chips;

disabling the common circuit in one or more other ones of the chips so as to reduce current otherwise consumed thereby;

coupling the enabled common circuit and the one or more disabled common circuits such that the enabled common circuit performs the common function for the selected chip and the other chips.

18. The method of claim 17, wherein:

each of the chips includes a selection circuit;

the disabling of the common circuit in the one or more other chips includes coupling a disabling voltage to the selection circuit therein, respectively; and the enabling of the common circuit in the selected chip includes not coupling a voltage to the selection circuit therein.

* * * * *